United States Patent
Milijevic et al.

(10) Patent No.: US 9,595,972 B2
(45) Date of Patent: Mar. 14, 2017

(54) DIGITAL PHASE LOCKED LOOP ARRANGEMENT WITH MASTER CLOCK REDUNDANCY

(71) Applicant: Microsemi Semiconductor ULC, Kanata (CA)

(72) Inventors: Slobodan Milijevic, Ottawa (CA); Johannes Hermanus Aloysius de Rijk, Rotterdam (NL); Paul H. L. M. Schram, Bergen op Zoom (NL); Mark A Warriner, Ottawa (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 15/064,678

(22) Filed: Mar. 9, 2016

(65) Prior Publication Data

US 2016/0301416 A1 Oct. 13, 2016

Related U.S. Application Data

(60) Provisional application No. 62/144,346, filed on Apr. 8, 2015, provisional application No. 62/144,611, filed on Apr. 8, 2015.

(51) Int. Cl.
| | | |
|---|---|---|
| *H03L 7/06* | (2006.01) | |
| *H03L 7/07* | (2006.01) | |
| *H03L 7/14* | (2006.01) | |

(52) U.S. Cl.
CPC ............. *H03L 7/07* (2013.01); *H03L 7/14* (2013.01); *H03L 2207/50* (2013.01)

(58) Field of Classification Search
USPC ................................. 327/147–149, 156–158
See application file for complete search history.

(56) References Cited

U.S. PATENT DOCUMENTS

| | | | | |
|---|---|---|---|---|
| 4,864,574 A | * | 9/1989 | Pritt ................... | G06F 11/0751 327/144 |
| 5,117,442 A | | 5/1992 | Hall | |
| 5,465,109 A | * | 11/1995 | Bowers ..................... | B41J 2/02 347/74 |
| 7,091,795 B1 | * | 8/2006 | Tsyrganovich ......... | H03L 7/199 327/156 |
| 7,242,740 B2 | | 7/2007 | Spijker et al. | |

(Continued)

OTHER PUBLICATIONS

International Search Report for parallel application PCT/CA2016/050272 issued by the Canadian Intellectual Property Office May 9, 2016.

(Continued)

*Primary Examiner* — Adam Houston
(74) *Attorney, Agent, or Firm* — Simon Kahn

(57) ABSTRACT

Master clock redundancy is provided for a digital phase locked loop having a digital controlled oscillator (DCO) driven by a master clock source, for example, a crystal oscillator. One of a plurality of a crystal oscillators generating clock signals is selected to drive the DCO. The performance of the crystal oscillators is monitored, and the DCO is switched from being driven by a previously selected crystal oscillator to a newly selected crystal oscillator upon loss of a clock signal from the previously selected crystal oscillator or when the performance of the previously selected crystal oscillator falls below a predetermined acceptable level.

20 Claims, 4 Drawing Sheets

(56) References Cited

U.S. PATENT DOCUMENTS

| | | | |
|---|---|---|---|
| 7,643,595 B2 | 1/2010 | Aweya et al. | |
| 2006/0119402 A1* | 6/2006 | Thomsen | H03L 7/0898 |
| | | | 327/105 |
| 2008/0048791 A1* | 2/2008 | Fahim | H03L 7/085 |
| | | | 331/1 A |
| 2010/0134166 A1* | 6/2010 | Kwak | G11C 7/1072 |
| | | | 327/158 |
| 2014/0320181 A1* | 10/2014 | Mitric | H03L 7/10 |
| | | | 327/156 |
| 2015/0222276 A1* | 8/2015 | Milijevic | H03L 7/087 |
| | | | 327/147 |
| 2015/0222280 A1* | 8/2015 | Allan | H03L 7/083 |
| | | | 327/157 |

OTHER PUBLICATIONS

Written Opinion of the International Searching Authority for parallel application PCT/CA2016/050272 issued by the Canadian Intellectual Property Office May 9, 2016.

* cited by examiner

DIGITAL PHASE LOCKED LOOP ARRANGEMENT WITH MASTER CLOCK REDUNDANCY

CROSS REFERENCE TO RELATED APPLICATION

This application claims the benefit under 35 USC 119(e) of U.S. provisional application No. 62/144,611 filed Apr. 8, 2015, the contents of which are herein incorporated by reference.

FIELD OF THE INVENTION

This invention relates to the field of precision timing, and in particular to a digital phase locked loop arrangement with master clock redundancy, for example, for use in telecommunications. The invention also relates to a method of implementing master clock redundancy in a digital phase locked loop.

BACKGROUND OF THE INVENTION

Most telecom/datacom systems are implemented with a number of digital/mixed signal integrated circuits (ICs), which require an accurate and stable clock source for normal operations. This clock is typically generated by a digital phase-locked loop (DPLL), which receives a recovered reference clock from a network port, cleans it from jitter and wander, and then synthesizes the frequencies required by different integrated circuits in the system. When the input reference clock is unavailable, the DPLL may also be operated in the free-run mode, wherein it continues to run without an input reference.

The DPLL requires a stable master clock, which is generated from an external crystal oscillator (XO) or temperature compensated variants, such as a temperature compensated crystal oscillator (TCXO) or an oven controlled crystal oscillator (OCXO).

In the case of master clock failure, the DPLL will instantly stop generating an output clock and the whole system will fail. XOs typically have a higher failure rate than ICs, and as such can dominate the overall failure rate of the whole system.

SUMMARY OF THE INVENTION

Embodiments of the invention address the problem of master clock failure by using two or more redundant XOs. When the first XO that feeds the DPLL fails, another XO takes over.

According to the present invention there is provided a digital phase locked loop arrangement with master clock redundancy, comprising: a plurality of master clock sources generating clock signals; a digital phase locked loop (DPLL) including at least one reference input and a digital controlled oscillator (DCO) driven by one of said plurality of master clock sources; clock monitors for monitoring the performance of said master clock sources; a first multiplexer for selecting one of said master clock sources to drive said DCO; and a controller programmed to control said multiplexer to switch said DCO from being driven by a previously selected one of said master clock sources to a newly selected one of said master clock sources upon loss of a clock signal from said previously selected master clock source or when the performance of said previously selected one of said master clock sources falls below a predetermined acceptable level.

The master clock sources may be crystal oscillators, but they could also be other types of clock source, such as SAW oscillators, MEMS oscillators, atomic clock or any device capable of delivering clock signals with the desired stability.

A digital controlled oscillator as defined herein means any device that uses a master clock and a digital representation of frequency and/or phase to generate an output clock. This includes gapped clock based implementations combined with an analog phase locked loop (APLL), or a straight fractional-N APLL, or a Digital-to-Time converter (DTC) used in a phase interpolator.

Typically, the DPLL with have a plurality of reference inputs, of which one can be selected by an input multiplexer. The DPLL can however run in the free-run mode without using any reference input.

Performance is defined herein as the ability of the crystal oscillators to perform their tasks in a satisfactory manner to enable the DPLL to perform within acceptable limits, for example, to maintain the required degree of frequency stability and accuracy.

The DPLL can successfully recover from XO failure with minimum effect at the output clock so that devices timed from DPLL do not undergo any adverse effects (no bit errors).

Embodiments of the invention detect not only when the first XO stops generating a clock but also when the XO drifts in frequency outside an allowed threshold. An example of such failure arises when the oven in an OCXO fails. In this case, the OCXO frequency will slowly drift from the nominal value as the OCXO cools down.

Embodiments of the invention also compensates for any frequency difference between active and redundant XO during switchover, which will in turn minimize frequency change at the output of DPLL.

According to another aspect of the present invention there is provided a digital phase locked loop arrangement with master clock redundancy, comprising: a plurality master clock sources generating clock signals; a digital phase locked loop (DPLL) including a digital controlled oscillator (DCO) driven by one of said plurality of master clock sources; clock monitors for monitoring the performance of said master clock sources; a first multiplexer for selecting one of said master clock sources to drive said DCO; and a controller programmed to control said multiplexer to switch said DCO from being driven by a previously selected one of said master clock sources to a newly selected one of said master clock sources upon loss of a clock signal from said previously selected master clock source or when the performance of said previously selected one of said master clock sources falls below a predetermined acceptable level.

BRIEF DESCRIPTION OF THE DRAWINGS

This invention will now be described in more detail, by way of example only, with reference to the accompanying drawings, in which:—

DETAILED DESCRIPTION OF PREFERRED EMBODIMENTS

Figure 1:
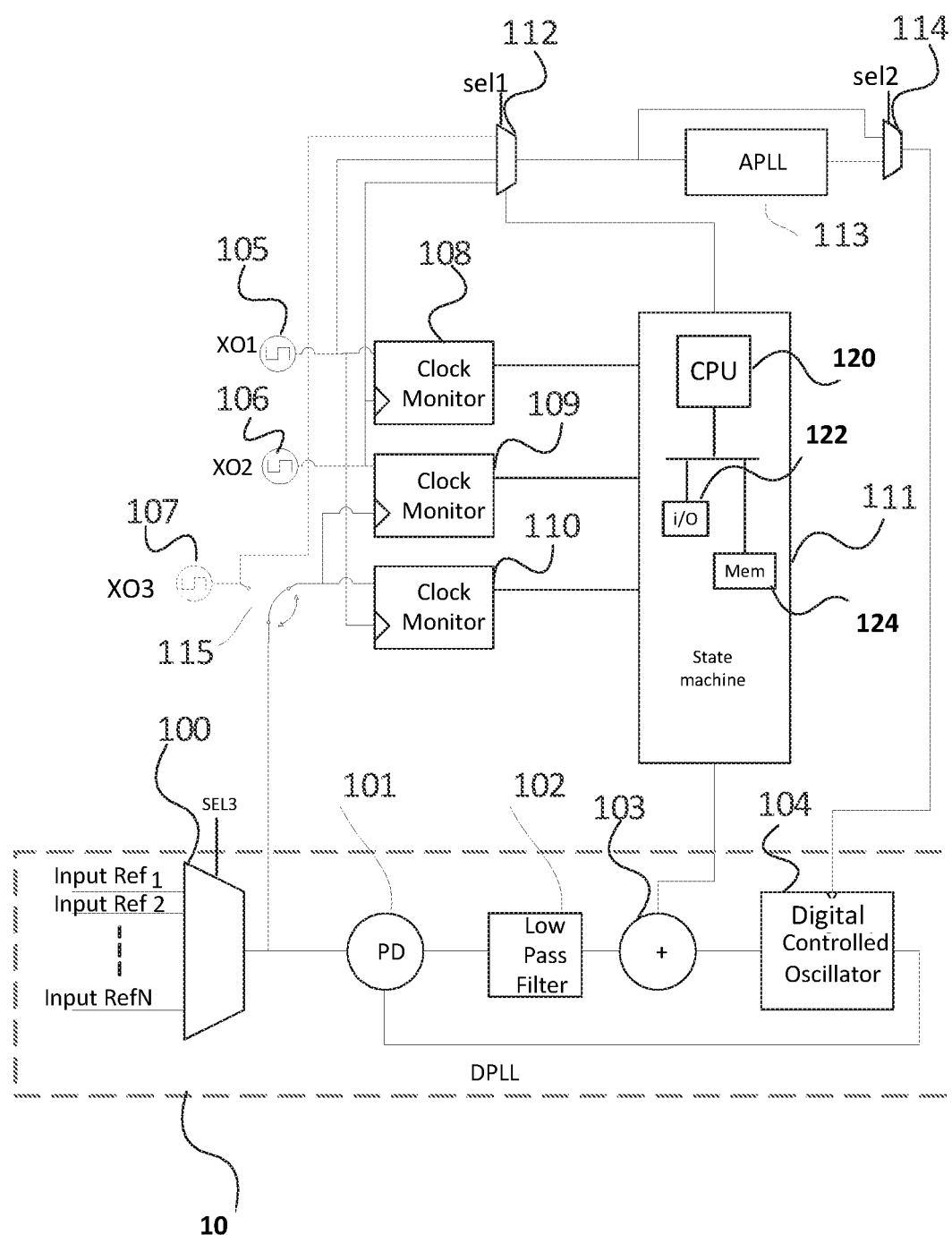
FIG. 1 is top-level block diagram of a DPLL arrangement with master clock redundancy according an embodiment of the invention.

Referring now to FIG. 1, the DPLL arrangement with master clock redundancy in accordance with an embodiment of the invention is shown. A DPLL 10 has an input reference selector circuit in the form of selection multiplexer 100, which selects one of N input signals, Input Ref1 to Input RefN in response to a selection signal sel3. The multiplexer 100 allows the DPLL to be locked to any of several independent reference signals. The DPLL 10 also comprises phase detector 101, low pass filter 102, adder 103 and digitally controlled oscillator (DCO) 104. The output of the DCO 104 is fed back to the phase detector 101.

The DPLL 10 needs a stable master clock for normal operation. In this non-limiting example, crystal oscillators (XOs) 105, 106, 107 provide this clock via a selection multiplexer 112, which is responsive to a selection sel1. Depending on the application, the selected XO clock can be directly used to drive the DCO 104 and other digital circuitry or first multiplied by an analog phase locked loop (APLL) 113. For this purpose, a multiplexer 114 selects either the output of the multiplexer 112 or the output of an APLL 113 in response to a selection signal sel2. The multiplexer 114 would be set on the power up (only once) depending on frequency of XOs. If XOs are high frequency ones (for example, 100 MHz and above) the APLL 113 will be bypassed. If they are lower frequency (which much more common) the internal APLL is need to multiply frequency.

The arrangement, including the assertion of selection signals sel1, sel2, is controlled by a controller 111 in the form of a state machine, which may be implemented in software in a processor. In the illustrated embodiment the controller 111 comprises central processing unit (CPU) 120, input/output block 122, and memory 124 containing a stored program to implement the functions of the state machine.

During normal operation, the controller selects one of XOs 105, 106, 107 via selection signal sel1 as active to drive the DPLL 10. The remaining XO(s) are used for backup.

Clock Monitors 108, 109, 110, constantly measure and monitor the frequencies of the XOs and report them to the controller 111. If the controller 111 determines that the frequency of the active XO 105, 106, 107 deviates by more than a configurable threshold (both positive and negative thresholds are included), for example exceeds or falls below a predetermined threshold, or fails entirely, the controller 111 will select a new XO via multiplexer 112. At the same time, the controller 111 will apply a frequency correction to adder 113, which will cancel out the frequency difference between the active and redundant XOs, thus minimizing any frequency change at the output of the DPLL 10. The clock monitors 108, 109, 110 thus serve as performance monitors continually monitoring the performance of their associated crystal oscillators to output an event indication when their performance, in this case frequency stability, departs from a predetermined acceptable level.

The clock monitors 108, 109, 110 operate in two different modes, selected by a switch 115. In the first mode, any selected one of the input reference signals, Input Ref1 . . . Input RefN, is used to monitor the master clock sources and only two XOs are required. Usually, the input signal that the reference DPLL is locked to is selected because it is usually the best one available. However, if another reference is available it could be used as well.

In the second mode, three XOs use a majority voting system to determine which XO has failed, without the requirement to make use of one of the input reference signals. With these three clocks three cross measurements are performed. For example if XO1 drifts outside the threshold, the clock monitor for XO1 will signal a failure. However, we do not know if XO1 drifted outside the range or the reference (XO2) measure XO1 drifted outside the range. To determine which one failed (XO1 or XO2), XO2 is checked against XO3, and XO1 is checked against XO3. If, for example, XO1 is the faulty oscillator, it will also show a failure when checked against XO3, whereas XO2 when checked against XO3 will not show a failure, and XO3 when checked against XO1 will show a failure.

Figure 2:
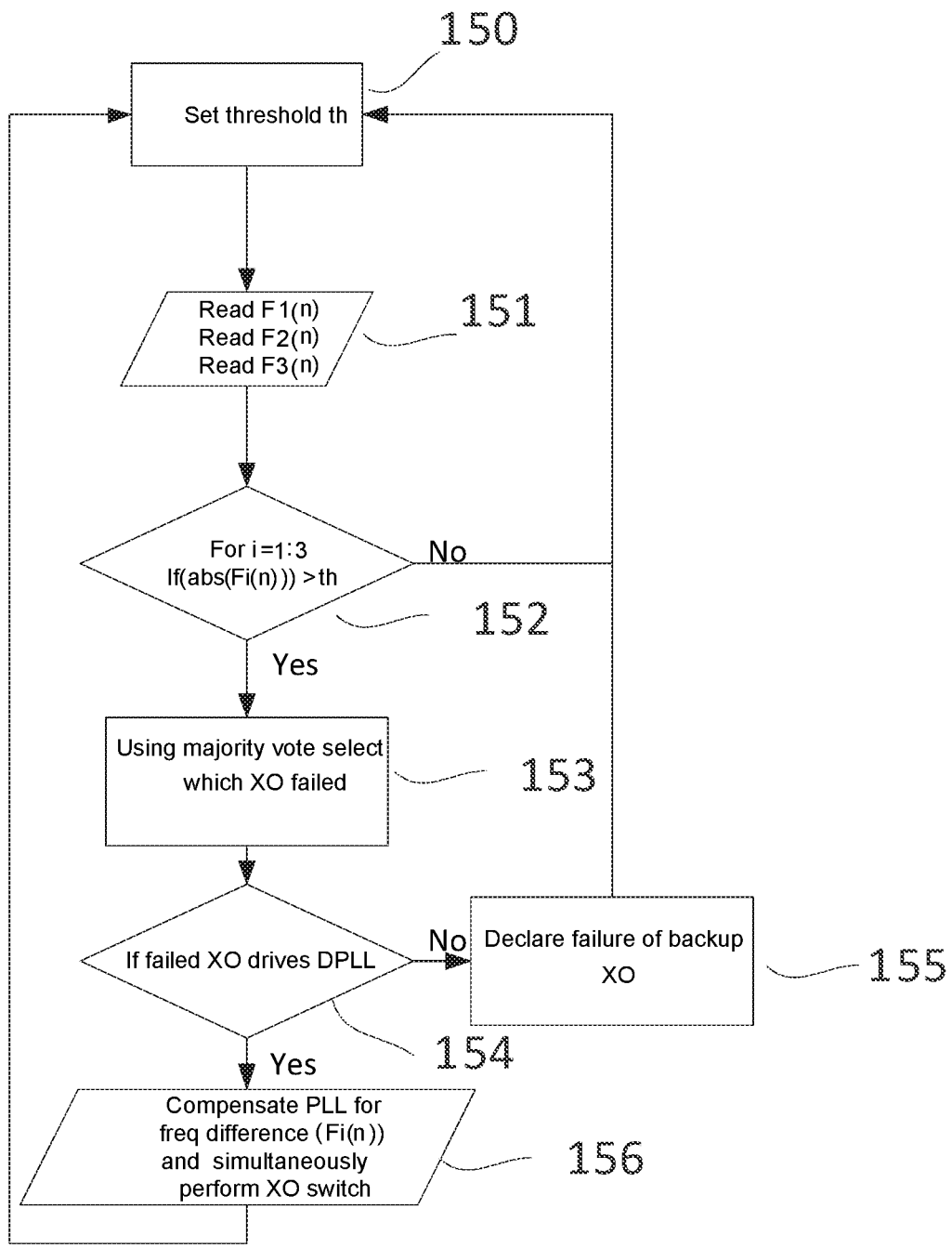
FIG. 2 is an algorithm implemented by the state machine (block 111) shown in FIG. 1.

FIG. 2 shows the operation of the state machine in the controller 111. At step 150 a configurable threshold th is set. At step 151, the state machine reads the measured frequencies $F1(n)$, $F2(n)$ and $F3(n)$, and responsive to the selected input reference signal checks if one of them exceeds the configurable threshold at step 152. Preferably, the state machine only returns a positive indication if the threshold is exceeded for a configurable monitoring time.

If the answer is no, the process flow loops back to the start and a flag will be set to declare that failed XO can no longer be used. Also, an alarm will be generated to the system to report this failure to the operator/user. If the answer is yes, i.e. one of the XOs has exceeded the threshold check, a majority vote is applied at step 153 to determine which XO has failed. A determination is made as step 154 whether the failed XO is currently active (i.e. driving the DPLL). If the answer is no, the state machine will declare a failure of the identified backup XO at step 155 and loop back to the start. If answer is yes, the state machine will select at step 156 an alternate XO 105, 106, 107 as the active XO to drive the DPLL 104. It will also compensate for the frequency difference between the failed XOs and the XO that takes over as the active XO.

Figure 3:
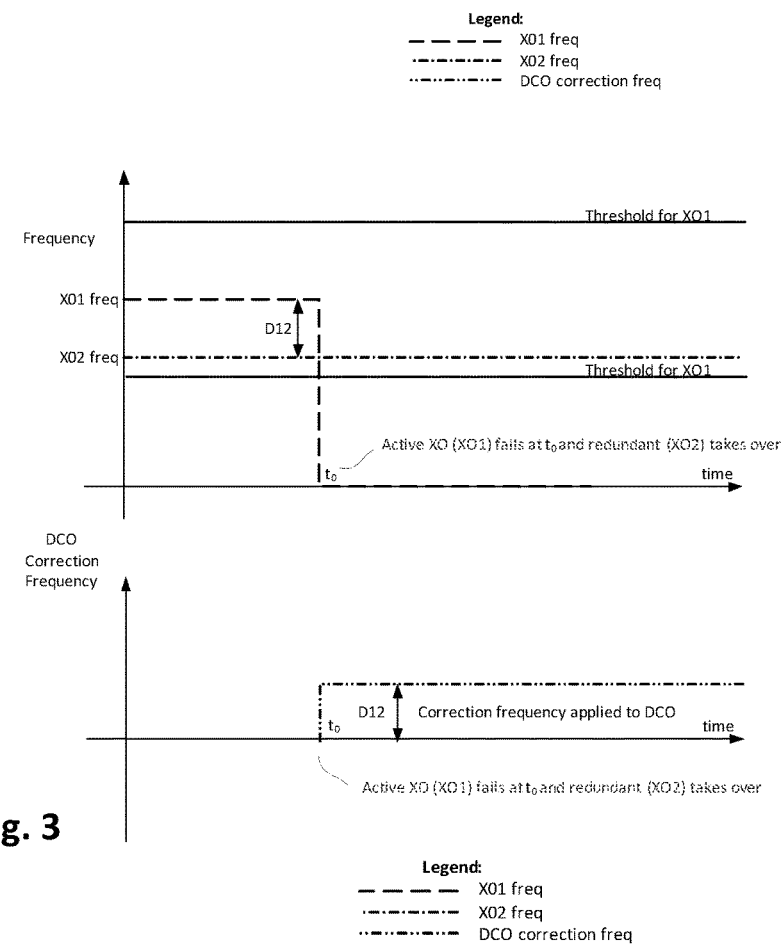
FIG. 3 is a timing diagram showing the switchover when the XO instantly fails.

FIG. 3 shows a timing diagram of the situation that occurs when the active XO instantly fails and its frequency drops to zero at time $t_0$. In this case the state machine 111 instantly switches to an alternative XO, determines the frequency difference D12 between the new XO (XO2) and the last stored good value for the previously active XO (XO1), and applies this frequency difference to the DCO 104 with opposite polarity via adder 103 to cancel out the frequency disturbance at the output of the DPLL resulting from the frequency difference between the XOs.

Figure 4:
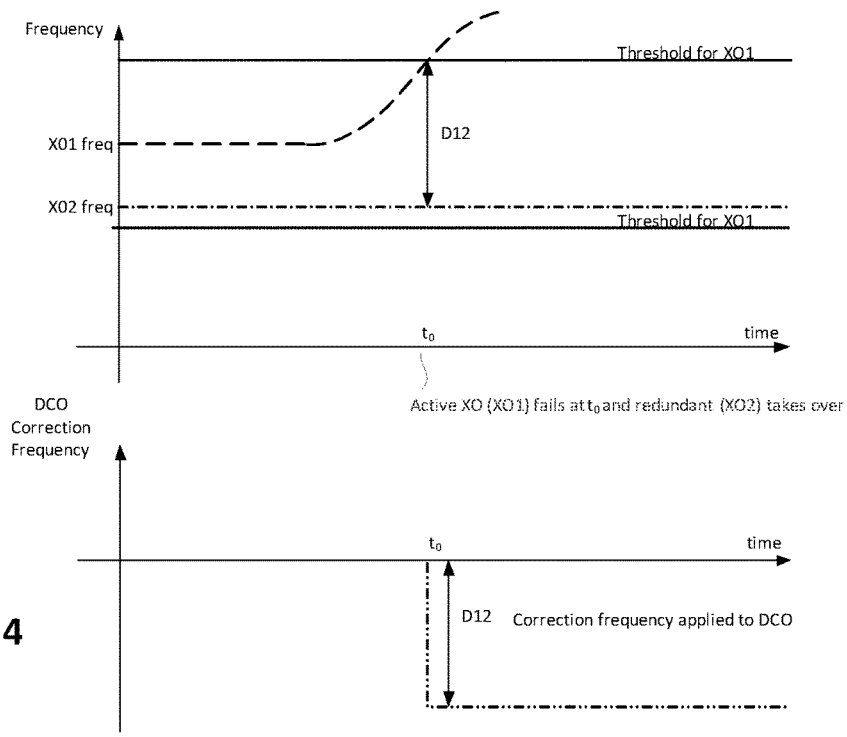
FIG. 4 is a timing diagram showing the switchover when the XO slowly drifts in frequency outside the predefined threshold.

FIG. 4 shows a timing diagram of the situation that occurs when the active XO (XO1) slowly drifts in frequency outside the predefined range. This type of failure might occur, for example, when the oven in an OCXO fails, causing frequency changes (typically increasing) as the OCXO cools down. If the XO used as a reference starts to drift, the threshold will move as well because the threshold is derived from the reference. The majority voting system decides whether or not to declare a failure. The state machine 111 switches to the alternate XO, in this case XO2, when the threshold for the XO XO1 is crossed and applies the frequency difference D12 with opposite polarity, via adder 103 to the DCO 104 at the same time. The frequency difference D12 is defined as the difference between the crossed threshold value for XO1 and the XO2 frequency value, which is the measured frequency difference between XO1 and XO2 just before the frequency switch occurs.

Figure 5:
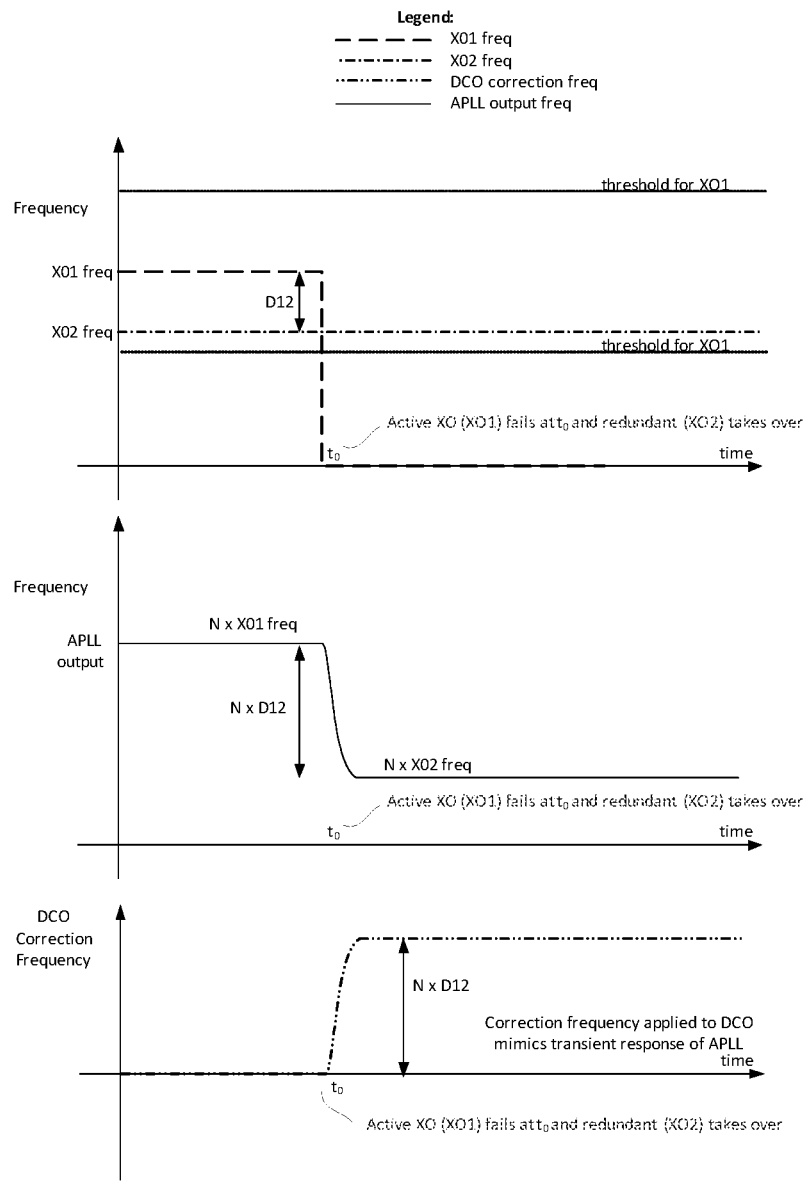
FIG. 5 is a timing diagram showing the switchover when the XO instantly fails but the digital controlled oscillator (DCO) is fed from an analog phase locked loop (APLL) which multiplies the XO frequency.

FIG. 5 shows a timing diagram in situations where the XO frequency is first multiplied by the APLL 113, and then the output of APLL 113 is used as master clock for the DPLL 10. When the active XO fails in this case, and the state machine switches between two XOs, the output frequency of APLL 113 will only change gradually, depending on the loop bandwidth of APLL 113. Because the loop bandwidth is known, the state machine 111 will apply a frequency correction to mimic the response of the APLL 113 but with opposite polarity by determining the frequency change over time and applying the frequency change, with opposite polarity, via adder 103 to the DCO 104 contemporaneously with the changing output frequency of the APLL 113.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A digital phase locked loop arrangement with master clock redundancy, comprising:
    a plurality of master clock sources in the form of stable oscillators generating local clock signals;
    a digital phase locked loop (DPLL) including a digital controlled oscillator (DCO) driven by one of said plurality of master clock sources;
    a first multiplexer for selecting one of a plurality of reference clock signals as an input to said DPLL;
    clock monitors for monitoring a performance of said plurality of master clock sources;
    a second multiplexer for selecting one of said master clock sources to drive said DCO; and
    a controller programmed to control said second multiplexer to switch said DCO from being driven by a previously selected one of said master clock sources to a newly selected one of said master clock sources upon loss of a clock signal from said previously selected master clock source or when the performance of said previously selected one of said master clock sources falls below a predetermined acceptable level.

2. A digital phase locked loop arrangement as claimed in claim 1, wherein said controller comprises a processor implementing a state machine.

3. A digital phase locked loop arrangement as claimed in claim 1, wherein said controller is programmed to switch said master clock sources when said previously selected master clock source experiences a frequency deviation that exceeds a configurable threshold.

4. A digital phase locked loop arrangement as claimed in claim 3, wherein said controller is programmed to switch said master clock sources when said frequency deviation is exceeded for a predetermined monitoring time.

5. A digital phase locked loop arrangement as claimed in claim 1, wherein said clock monitors are configured to monitor the performance of said at least two master clock sources by comparing their outputs with at least one of said input reference clock signals.

6. A digital phase locked loop arrangement as claimed in claim 1, comprising at least three said master clock sources, and wherein said controller is programmed to determine when the performance of said previously selected one of said master clock sources has fallen below said predetermined acceptable level by implementing a majority voting scheme wherein the performance of said master clock sources is continually compared with each other.

7. A digital phase locked loop arrangement as claimed in claim 5, further comprising a switch for coupling inputs of said monitors to either said master clock sources and an output of said second multiplexer.

8. A digital phase locked loop arrangement as claimed in claim 1, further comprising an adder upstream of said DCO having first and second inputs, said adder receiving a frequency control signal at said first input, and wherein upon switching master clock sources, said controller is programmed to apply a frequency correction to said second input to compensate for any frequency difference between the previously selected master clock source and the newly-selected master clock source.

9. A digital phase locked loop arrangement as claimed in claim 1, further comprising an adder upstream of said DCO having first and second inputs, a third multiplexer, and an analog phase locked loop (APLL) for multiplying the output of said selected one of said master clock sources, wherein an output of said second multiplexer is coupled to a first input of said third multiplexer and an input of said APLL, and an output of said APLL is coupled to a second input of said third multiplexer, said third multiplexer being responsive to a selection signal to select the output of said second multiplexer or the output of said APLL, and wherein upon switching to a newly selected master clock source the controller is programmed to apply a frequency correction to said second input to compensate for any frequency difference between the previously selected master clock source and the response of the APLL.

10. A digital phase locked loop arrangement as claimed in claim 9, wherein said frequency correction mimics a response of said APLL to said newly selected master clock source with opposite polarity.

11. A digital phase locked loop arrangement as claimed in claim 1, wherein said master clock sources are crystal oscillators.

12. A method of providing master clock redundancy for a digital phase locked loop (DPLL) having a digital controlled oscillator (DCO) driven by a local master clock source acting as a master clock source, the method comprising:
    selecting one of a plurality of input reference clock signals as an input to said DPLL;
    providing a plurality of said master clock sources in the form of stable oscillators generating clock signals;
    selecting one of said master clock sources to drive said DCO;
    monitoring a performance of said master clock sources; and
    switching said DCO from being driven by a previously selected one of said master clock sources to a newly selected one of said master clock sources upon loss of a clock signal from said previously selected master clock source or when the performance of said previously selected one of said master clock sources falls below a predetermined acceptable level.

13. A method as claimed in claim 12, wherein a processor implementing a state machine controls the switching of said master clock sources.

14. A method as claimed in claim 12, comprising switching said master clock sources when said previously selected master clock source experiences a frequency deviation that exceeds a configurable threshold.

15. A method as claimed in claim 12, comprising switching said master clock sources when said frequency deviation is exceeded for a predetermined monitoring time.

16. A method as claimed in claim 12, wherein said clock monitors monitor the performance of said master clock sources by comparing their outputs with one of said input reference clock signals.

17. A method as claimed in claim 12, comprising implementing a majority voting scheme among at least three said master clock sources wherein the performance of said master clock sources is continually compared with each other to determine when the performance of said previously selected one of said master clock sources has fallen below said predetermined acceptable level.

18. A method as claimed in claim 12, further comprising adding a frequency correction to a control signal for said DCO to compensate for any frequency difference between the previously selected master clock source and the newly-selected master clock source.

19. A method as claimed in claim 12, further comprising multiplying the output of said selected one of said master clock sources in an analog phase locked loop (APLL), and applying a frequency correction to a control signal for said DCO to compensate for any frequency difference between the previously selected master clock source while allowing for the response of the APLL.

20. A method as claimed in claim 19, wherein said frequency correction mimics a response of said APLL to the newly-selected master clock source with opposite polarity.

* * * * *